July 21, 1964
J. THUY
3,142,020
SEMICONDUCTOR ARRANGEMENT HAVING LATTICE FAULTS IN ITS BREAKDOWN REGION
Filed Sept. 12, 1960
FIG. I.
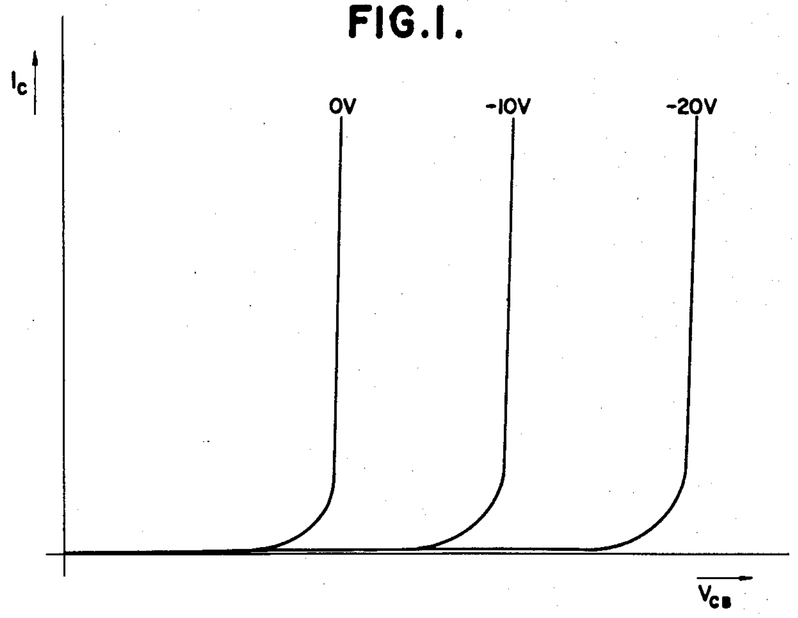
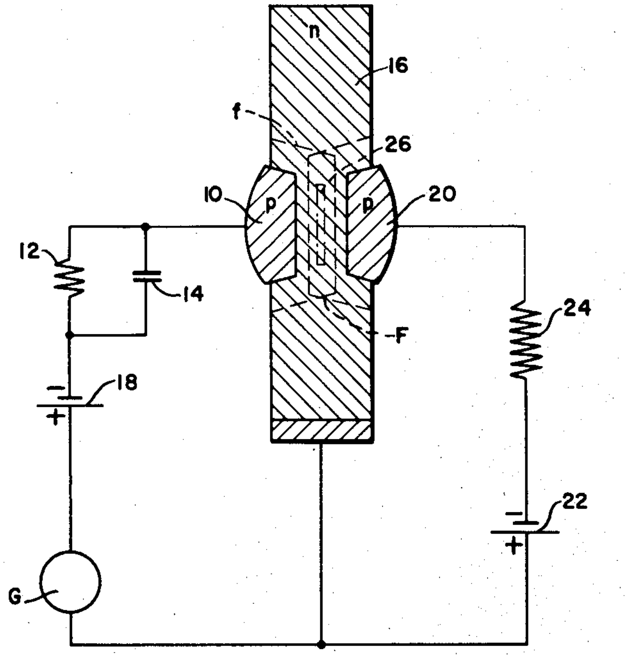
FIG. 2.
INVENTOR
Joachim Thuy
BY George M Spencer
ATTORNEY United States Patent Office 3,142,020
Patented July 21, 1964

3,142,020

SEMICONDUCTOR ARRANGEMENT HAVING LATTICE FAULTS IN ITS BREAKDOWN REGION

Joachim Thuy, Ulm-Soflingen, Germany, assignor to Telefunken Aktiengesellschaft, Berlin, Germany Filed Sept. 12, 1960, Ser. No. 55,439
Claims priority, application Germany Sept. 15, 1959
9 Claims. (Cl. 330—39)

The present invention relates to a semiconductor arrangement for controlling electrical energy with at least two pn-junctions.

The high-frequency characteristics of ordinary transistors are determined mainly by the diffusion of their carriers, i.e., by the transit time of the charge carriers through the base zone. Inasmuch as this diffusion takes place relatively slowly, the cut-off frequency of such transistors often does not exceed 500 kilocycles to 1 megacycle. With special transistor types, in which the base layer thickness is particularly small, cut-off frequencies up to 20 megacycles are attained.

In order to raise the cut-off frequency still higher, it is known to obtain by diffusion an additional electrical field on the base, which additional field accelerates the movement of the charge carriers. In such transistors, known as drift transistors, it is now possible to obtain cut-off frequencies of the order of 100 megacycles.

It is an object of the present invention to provide an amplifying device which has good high frequency characteristics and, with this object in view, the present invention resides mainly in a novel amplifying device in which the diffusion of carriers plays no part.

Additional objects and advantages of the present invention will become apparent upon consideration of the following description when taken in conjunction with the accompanying drawing, in which:

FIGURE 1 is a current vs. voltage plot.

FIGURE 2 is a schematic showing of a semiconductor device and circuit according to the present invention.

Before considering the drawing, the following should be noted:

According to the present invention, a semiconductor device for controlling electrical energy having at least two p-n junctions is provided between these two p-n junctions with a breakthrough zone consisting of carrier generation centers, and the p-n junctions which are present in the semiconductor arrangement are all biased in the high-resistance or reverse direction.

The requisite breakthrough zone between the two p-n junctions can operate either on the Zener breakdown principle or according to the avalanche principle in which carrier multiplication occurs in the breakdown region. In the case of the Zener breakdown, the electrical field is so strong that an internal field emission arises in the semiconductor. In the case of the avalanche breakdown, the carrier multiplication is due to the collision of free charge carriers with crystal lattice. The strength of each effect depends on the field strength existing in the breakdown region. Crystal lattice structures having faults are particularly well suited as breakdown regions. These faults can be produced by purposely building in regions of faults in locations between lattices comprising carrier generation centers.

If the p-n junctions are biased in the reverse direction in such a manner that the fields resulting from the blocked layers overlap each other, it is possible to cancel out fully the field strengths in the regions of overlapping. By appropriate selection of the applied reverse bias voltages, a field strength of any magnitude between zero and a permissible maximum can be obtained in the breakdown region. In order to obtain accurate field cancellation, the relative positions of the p-n junctions and the breakdown region between them must be accurately maintained and the reverse bias applied to the p-n junctions must accurately be determined. The degree of overlapping of the fields can be adjusted by varying the reverse bias on the junctions.

In the simplest case, there are only two p-n junctions which are spaced apart a certain distance. The depletion layer of one electrode (which is kept at a constant voltage) remains constant in width, but the other depletion layer (of the control electrode) has its width controlled in a cyclic manner determined by the input signal voltage. If both fields exactly cancel each other in the breakdown region, then no current other than the reverse saturation current will flow between the output electrode and the base. If, however, the cancellation is incomplete and a field becomes effective in the breakdown region, then a more or less strong breakdown current, which is dependent on the overlapping field strength, will be added to the reverse saturation current.

The amplification factor of the arrangement according to the present invention depends on the geometric position of the breakdown zone between the control and the other electrode(s). The nearer the breakdown region is to the control electrode the more sensitive the device will be to input signal voltages, i.e., a relatively small control voltage can control the breakdown of the electrode path of the other electrode(s). Amplification is obtained by the fact that in the base and path of the output electrode there is a relatively high current capability which can be controlled by small input voltages with virtually no power consumption.

Referring now to the drawing, FIGURE 1 is a plot of the current $I_C$ flowing to the output electrode versus the voltage $V_{CB}$ on the output electrode. It should be noted that the characteristic curves of the semiconductor control device according to the present invention are relatively steep. The illustrated family of curves is a typical family of characteristic curves for breakdown voltages, in which the breakdown voltage is dependent upon the voltage at the control electrode. As will readily be seen from the curves in FIGURE 1, such an arrangement can also be used to regulate voltages; and these voltages to be regulated can be controlled within wide ranges.

FIGURE 2 shows a semiconductor arrangement according to the present invention together with an input signal source G which serves for control purposes. In order to prevent overloading of the semiconductor system, the control electrode 10, which is reverse biased by a source 18, has connected ahead of it a protective resistance 12 which is shunted for high frequencies by a capacitor 14. The circuit including the control electrode 10 and the base electrode 16 is the signal input circuit. The circuit between the output electrode 20 and the base electrode 16, which includes the output voltage source 22 and a load resistance 24, is the so-called output circuit. FIGURE 2 shows the case in which the electric fields, represented by the dashed lines *f* nad F, overlap each other in the region of the breakthrough zone 26. The base consists of n-type semiconductor material, but a p-type material is also suitable if the electrodes of the opposite conductive type are correspondingly changed to the n-type.

The common semiconductor materials as, for example, germanium, silicon or the intermetallic combinations, can be used as the material for the semiconductor body. In the particular example of FIGURE 2, the control and output electrodes are alloyed electrodes, but other laminar electrodes may be used instead.

In the following an example is given at which the semiconductor device comprises a body of germanium doped with about $5.10^{13}$ n-impurities and copper for receiving the breakdown region. The breakdown region in the center of the germanium body can be produced for instance by an outdiffusion process. When the outdiffusion process has been finished alloy material, for instance indium, is alloyed on both sides of the body in such a manner that the distance between the breakdown region and the pn-junction of the control electrode is as small as possible, while the distance between the breakdown region and the other pn-junction shall be approximately 20 microns. To the electrode with the bigger distance from the breakdown region a voltage of about 20 volts is applied, while the voltage of the other electrode amounts approximately to 1 volt.

It will be understood that the above description of the present invention is susceptible to various modifications, changes and adaptations, and the same are intended to be comprehended within the meaning and range of equivalents of the appended claims.

I claim:

1. A semiconductor device for controlling electrical currents comprising a semiconductor body having at least two pn-junctions, said body having a preferred breakdown region having lattice faults comprising carrier generation centers, and said region being spaced within the body from said junctions and located in a zone of the body in which the electric fields of said junctions overlap in mutual opposition when the junctions are reverse-biased.

2. A device as set forth in claim 1 wherein electrodes are fixed to the body in mutually opposed relationship and said breakdown region is disposed between the electrodes and spaced from the junctions thereof with the body.

3. A device as set forth in claim 2 wherein the spacings of the breakdown region from the junctions and the doping of the semiconductor material are selected such that reverse bias voltages across the junctions are sufficient to overlap and the electric field in the vicinity of the breakdown region from each junction will not break down in the remaining lattice of the body.

4. A device as set forth in claim 1 wherein the semiconductor material is germanium.

5. A device as set forth in claim 1 wherein the semiconductor material is silicon.

6. A device as set forth in claim 1 wherein the semiconductor material is an intermetallic alloy.

7. A device as set forth in claim 1 wherein the semiconductor device has an n-doped base.

8. A device as set forth in claim 1 wherein the semiconductor device has a p-doped base.

9. A semiconductor device and circuit for amplifying an input signal, comprising, in combination: a semiconductor triode having a body doped to comprise one semiconductor polarity type and having a control electrode and an output electrode both doped to comprise the opposite semiconductor polarity type and said electrodes being fixed to said body to form mutually spaced junctions; a source of direct potential connected to reverse bias said control-electrode junction, the input signal being connected to the control electrode; a load impedance coupled to said output electrode and to a source of supply voltage connected to reverse bias the junction of the output electrode; and a preferred breakdown region in said body having lattice faults comprising carrier generation centers, said region being spaced from said electrodes and within the electrical fields thereof and located with respect to the electrodes so that said fields substantially cancel in the absence of an input signal.

References Cited in the file of this patent

UNITED STATES PATENTS

| | | |
|---|---|---|
| 2,644,895 | Lo | July 7, 1953 |
| 2,651,831 | Bond et al. | Sept. 15, 1953 |
| 2,750,453 | Pritchard | June 12, 1956 |
| 2,764,642 | Shockley | Sept. 25, 1956 |
| 2,795,742 | Pfann | June 11, 1957 |
| 2,802,071 | Lin | Aug. 6, 1957 |

FOREIGN PATENTS

| | | |
|---|---|---|
| 719,873 | Great Britain | Dec. 8, 1954 |

OTHER REFERENCES

Raytheon Semiconductor Engineering File, article by Sheehan, "Some Practical Considerations Concerning the Limiting Operating Voltages of Junction Transistors," January 1955.

The Bell System Technical Journal, article by Miller and Ebers, "Alloyed Junction Avalanche Transistors," pages 883–902, September 1955.